United States Patent
Ishikawa et al.

(10) Patent No.: US 11,081,576 B2
(45) Date of Patent: Aug. 3, 2021

(54) INSULATED-GATE SEMICONDUCTOR DEVICE AND METHOD OF MANUFACTURING THE SAME

(71) Applicant: FUJI ELECTRIC CO., LTD., Kawasaki (JP)

(72) Inventors: Takamasa Ishikawa, Matsumoto (JP); Seiji Noguchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/726,289

(22) Filed: Dec. 24, 2019

(65) Prior Publication Data

US 2020/0273971 A1 Aug. 27, 2020

(30) Foreign Application Priority Data

Feb. 25, 2019 (JP) ................. JP2019-31543

(51) Int. Cl.
*H01L 29/739* (2006.01)
*H01L 29/66* (2006.01)
(Continued)

(52) U.S. Cl.
CPC .... *H01L 29/7397* (2013.01); *H01L 21/76802* (2013.01); *H01L 21/76877* (2013.01); *H01L 22/14* (2013.01); *H01L 29/0696* (2013.01); *H01L 29/0804* (2013.01); *H01L 29/0821* (2013.01); *H01L 29/1004* (2013.01); *H01L 29/4236* (2013.01); *H01L 29/66348* (2013.01); *H01L 21/02271* (2013.01); *H01L 21/266* (2013.01); *H01L 21/26513* (2013.01); *H01L 21/28035* (2013.01); *H01L 21/28525* (2013.01); *H01L 21/31116* (2013.01);
(Continued)

(58) Field of Classification Search
CPC ............. H01L 29/7813; H01L 29/7825; H01L 29/66613–66628; H01L 29/42336; H01L 29/42352; H01L 29/4236; H01L 29/42356; H01L 29/66734; H01L 22/30; H01L 22/32; H01L 22/34
See application file for complete search history.

(56) References Cited

U.S. PATENT DOCUMENTS 8,698,195 B2 * 4/2014 Oya ................... H01L 29/0696
257/139
2016/0020310 A1 * 1/2016 Shiga .................. H01L 29/407
257/139

(Continued)

FOREIGN PATENT DOCUMENTS

JP 6304445 B2 4/2018

*Primary Examiner* — Syed I Gheyas

(57) ABSTRACT

A method of manufacturing an insulated-gate semiconductor device, includes: digging a gate trench and a dummy trench; burying a dummy electrode in the dummy trench via a gate insulating film and burying a gate electrode in the gate trench via the gate insulating film; exposing an upper portion of the dummy electrode and selectively forming an insulating film for testing so as to cover the gate electrode; depositing a conductive film for testing on the dummy electrode and the insulating film for testing; and selectively testing an insulating property of the gate insulating film in the dummy trench by applying a voltage between the conductive film for testing and the charge transport region.

12 Claims, 13 Drawing Sheets

(51) Int. Cl.
  *H01L 21/66*   (2006.01)
  *H01L 21/768*  (2006.01)
  *H01L 29/06*   (2006.01)
  *H01L 29/10*   (2006.01)
  *H01L 29/08*   (2006.01)
  *H01L 29/423*  (2006.01)
  H01L 29/772   (2006.01)
  H01L 21/265   (2006.01)
  H01L 21/266   (2006.01)
  H01L 21/311   (2006.01)
  H01L 21/02    (2006.01)
  H01L 21/28    (2006.01)
  H01L 21/285   (2006.01)
  H01L 29/78    (2006.01)

(52) U.S. Cl.
  CPC .. *H01L 29/66416* (2013.01); *H01L 29/66734* (2013.01); *H01L 29/7722* (2013.01); *H01L 29/7813* (2013.01)

(56) References Cited

U.S. PATENT DOCUMENTS

2017/0162458 A1   6/2017  Onozawa
2018/0240721 A1*  8/2018  Sakurai ................... H01L 29/94

* cited by examiner

INSULATED-GATE SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2019-031543 filed on Feb. 25, 2019, the entire contents of which are incorporated by reference herein.

BACKGROUND OF THE INVENTION

1. Field of the Invention

The present invention relates to an insulated-gate semiconductor device having a trench gate structure and a method of manufacturing the insulated-gate semiconductor device.

2. Description of the Related Art

Insulated-gate bipolar transistors (IGBTs) having a trench gate structure are known that have a structure in which a dummy electrode is buried in a part of a plurality of trenches (in a dummy trench), and is electrically connected to an emitter electrode so as to reduce a capacitance between a gate and a collector causing switching loss.

JP 6304445 discloses a method of screening out defective gate insulating films in all of the trenches before gate trenches and dummy trenches are separated from each other in terms of a device configuration so as to keep the quality of the gate insulating films in the dummy trenches.

The method disclosed in JP 6304445 conducts the screening test for the gate insulating films in all of the trenches at the same time. This test needs to use a relatively large level of voltage to be applied during the test, producing a large amount of particles when defective elements are broken. To decrease the amount of particles, the conditions of the screening could be changed depending on the resistance necessary for the gate insulating films in the dummy trenches. However, such a change further requires an additional screening test for the gate insulating films in the gate trenches after the manufacture process ends, resulting in a reduction in resistance to time-dependent dielectric breakdown (TDDB). If the screening is canceled after the completion of the manufacturing process, the incidence of damage caused in the rest of the process after the first screening cannot be screened out.

SUMMARY OF THE INVENTION

In response to the above issue, the present invention provides an insulated-gate semiconductor device and a method of the insulated-gate semiconductor device enabling screening of defects of gate insulating films in dummy trenches, independently of gate insulating films in gate trenches, while avoiding an increase in the number of steps.

An aspect of the present invention inheres in an insulated-gate semiconductor device, encompassing: a charge transport region of a first conductivity-type; an injection control region of a second conductivity-type provided on the charge transport region; a main charge supply region of the first conductivity-type provide on the injection control region; a dummy electrode buried, via a gate insulating film, in a dummy trench penetrating the main charge supply region and the injection control region to reach the charge transport region; a gate electrode buried, via the gate insulating film, in a gate trench penetrating the main charge supply region and the injection control region to reach the charge transport region; a first interlayer insulating film provided on the gate electrode; and a second interlayer insulating film provided on the dummy electrode, wherein the first interlayer insulating film having a stacked structure including a greater number of insulating films by at least one layer than the second interlayer insulating film.

Another aspect of the present invention inheres in a method of manufacturing an insulated-gate semiconductor device, encompassing: forming an injection control region of a second conductivity-type on a charge transport region of a first conductivity-type; forming a main charge supply region of the first conductivity-type on the injection control region; digging a gate trench and a dummy trench so as to penetrate the main charge supply region and the injection control region; burying a dummy electrode in the dummy trench via a gate insulating film and burying a gate electrode in the gate trench via the gate insulating film; exposing an upper portion of the dummy electrode and selectively forming an insulating film for testing so as to cover the gate electrode; depositing a conductive film for testing on the dummy electrode and the insulating film for testing; and selectively testing an insulating property of the gate insulating film in the dummy trench by applying a voltage between the conductive film for testing and the charge transport region.

DETAILED DESCRIPTION

Figure 1:
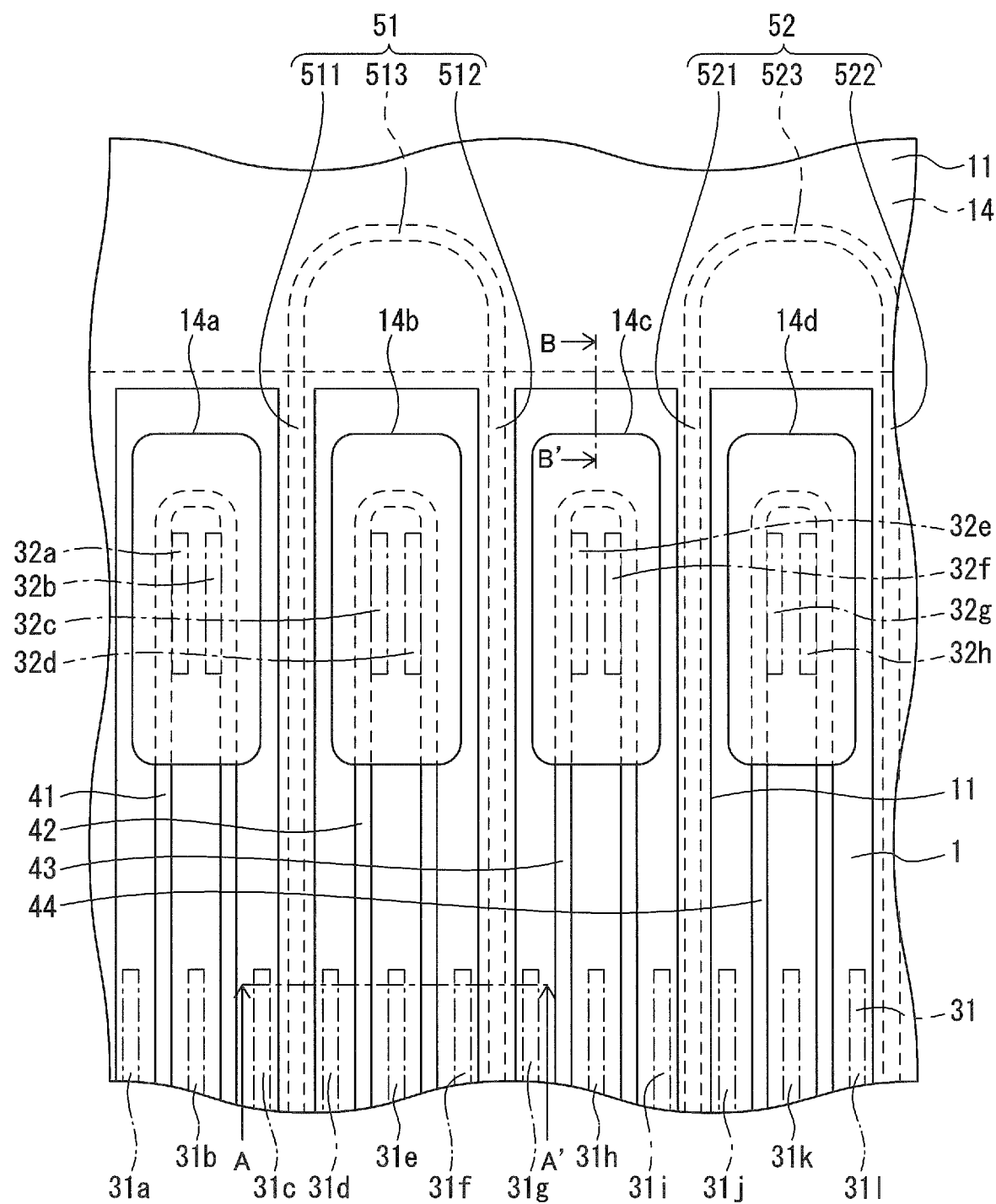
FIG. 1 is a plan view illustrating an insulated-gate semiconductor device according to an embodiment of the present invention.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the Specification, a "main charge supply region" of the insulated-gate semiconductor device means a region which supplies carriers as a main current. The main charge supply region is assigned to a semiconductor region which will be an emitter region or a collector region in an insulated-gate bipolar transistor (IGBT), a source region or a drain region in a metal-insulator-semiconductor field-effect transistor (MISFET) or a metal-insulator-semiconductor static induction transistor (MISSIT), and an anode region or a cathode region in a metal-insulator-semiconductor thyristor such as a MIS control static induction (SI) thyristor. A "main charge reception region" means a region which receive majority carriers as a main current. The main charge reception region is assigned to a semiconductor region which will not be the main charge supply region and will be the source region or the drain region in the MISFET or the MISSIT, the emitter region or the collector region in the IGBT, and the anode region or the cathode region in the MIS control SI thyristor or the GTO thyristor. Note that there is a case that minority carriers, which have charges opposite to majority carries as a main current, are supplied from the main charge supply region in a semiconductor device such as IGBT performing a bipolar operation.

That is, when the main charge supply region is the source region, the main charge reception region means the drain region. The main current flow between the main charge supply region and the main charge reception region. For example, the main current is assigned to a collector current in IGBT. When the main charge supply region is the emitter region, the main charge reception region means the collector region. When the main charge supply region is the anode region, the main charge reception region means the cathode region. In such as MISFET, a function of the main charge supply region and a function of the main charge reception region are exchangeable each other by exchanging a bias relationship. An electrode which is electrically connected to the main charge supply region by such as ohmic contact is defined as a "main charge supply electrode". An electrode which is electrically connected to the main charge reception region by such as ohmic contact is defined as a "main charge reception region". A plug for connection or a silicide layer may be provided between the main charge supply region and the main charge supply electrode or between the main charge reception region and the main charge reception electrode.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

Further, definitions of directions such as an up-and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

<Insulated-Gate Semiconductor Device>

An insulated-gate semiconductor device according to the embodiment is illustrated below with an IGBT having a trench gate structure. The insulated-gate semiconductor device according to the embodiment may be a reverse-conducting IGBT (RC-IGBT) including an IGBT and a freewheeling diode (FWD) integrated on a single chip.

As illustrated in FIG. 1, the insulated-gate semiconductor device according to the embodiment includes gate trenches 51 and 52 and dummy trenches 41, 42, 43, and 44. FIG. 1 omits elements, such as interlayer insulating films, a main charge supply electrode (emitter electrode), and a passivation film, deposited on the gate trenches 51 and 52 and the dummy trenches 41 to 44 for brevity. FIG. 1 schematically indicates a gate surface interconnection 14 and the gate trenches 51 and 52 deposited under an insulating film for testing 11 by the broken lines for illustration purposes. FIG. 1 also schematically indicates the dummy trenches 41 to 44 by the broken lines deposited under connection lands 14a, 14b, 14c, and 14d.

The respective dummy trenches 41 to 44 each have a flat O-shaped planar pattern in which both upper ends and lower ends of doubled stripes extending in parallel are connected to each other. FIG. 1 omits the lower ends of the respective stripes. The dummy trenches 41 to 44 are repeatedly provided such that the respective doubled stripes are arranged in parallel. The specifications such as the number and width of the dummy trenches 41 to 44 and the length of the stripes are determined as appropriate. The dummy trenches 41 to 44 may each have an I-shaped planar pattern instead of the O-shaped planar pattern.

The respective gate trenches 51 and 52 each have a flat O-shaped planar pattern to surround the circumferences of the respective dummy trenches 42 and 44. The gate trench 51 includes stripes 511 and 512 extending parallel to the respective stripes of the dummy trenches 41 to 44, and a connection part 513 connecting the stripes 511 and 512 adjacent to each other. The gate trench 52 includes stripes 521 and 522 extending parallel to the respective stripes of the dummy trenches 41 to 44, and a connection part 523 connecting the stripes 521 and 522 adjacent to each other.

The specifications such as the number and width of the gate trenches 51 and 52 and the length of the stripes 511, 512, 521, and 522 are determined as appropriate. The width of the gate trenches 51 and 52 may be either identical to or different from the width of the dummy trenches 41 and 44. The gate trenches 51 and 52 may each be provided into an inverted U-shaped planar pattern and connected together to meander between the dummy trenches 41 to 44 so as to implement a meander line structure, instead of the O-shaped planar pattern.

The gate surface interconnection 14 is arranged over the connection parts 513 and 523 of the gate trenches 51 and 52. The connection lands 15a to 14d are separated from the gate surface interconnection 14 and arranged over the end portions of the dummy trenches 41 to 44. The gate surface interconnection 14 and the connection lands 15a to 14d are made of polysilicon (doped polysilicon: DODOS) to which impurity ions such as phosphorus (P) are doped at a high concentration.

Figure 2:
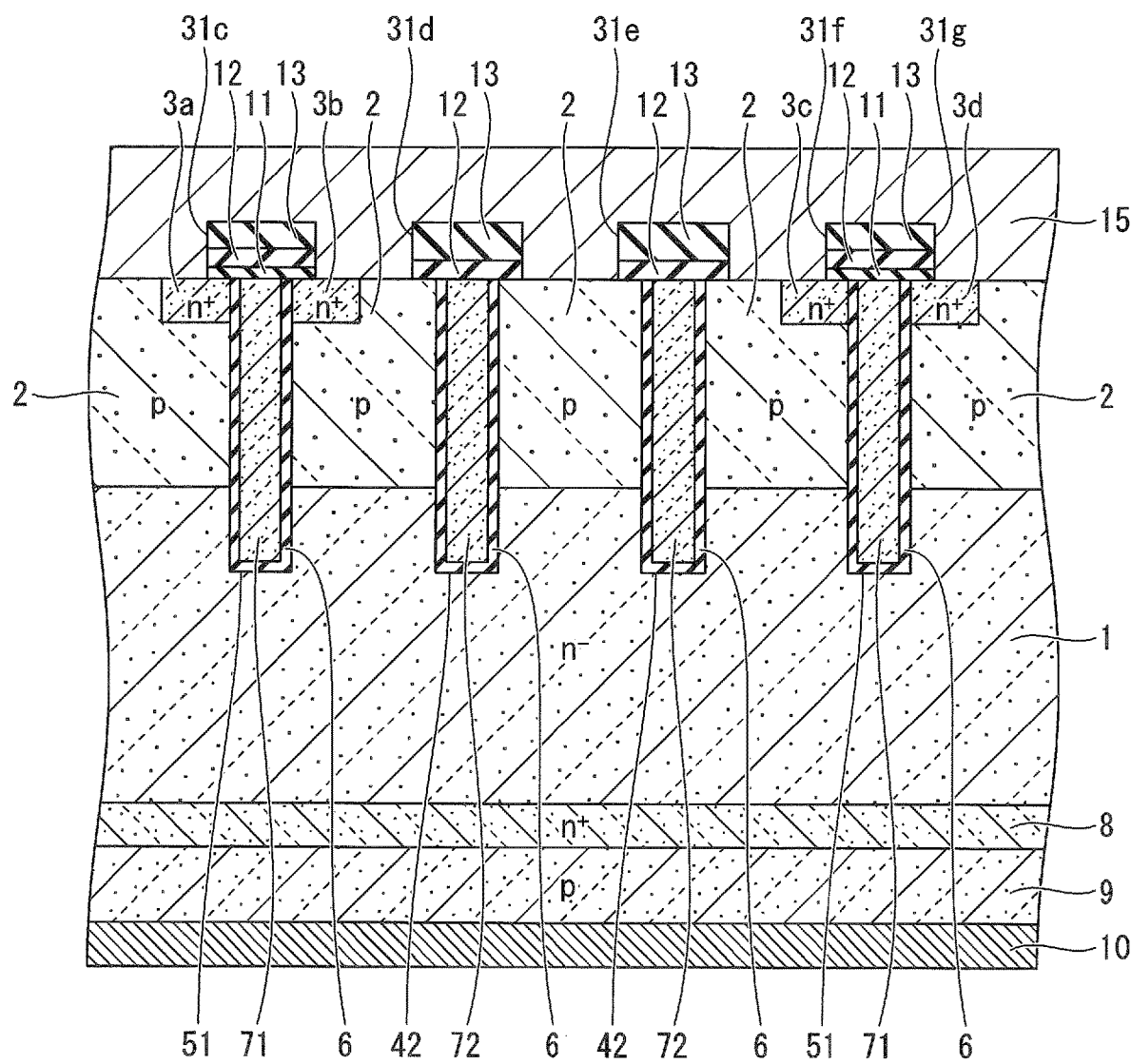
FIG. 2 is a cross-sectional view as viewed from direction A-A' in FIG. 1.

FIG. 2 is a cross-sectional view as viewed from direction A-A' in FIG. 1. As illustrated in FIG. 2, the insulated-gate semiconductor device according to the embodiment includes a charge transport region (drift region) 1 of a first conductivity-type ($n^-$-type). The charge transport region 1 is a semiconductor region which transports carriers (electrons) as a main current in a drift electric field. An injection control region (base region) 2 as a body region of a second conductivity-type (p-type) is deposited on the charge transport region 1. The injection control region 2 is a semiconductor region which controls the carriers to be injected to the charge transport region 1. Main charge supply regions (emitter regions) 3a, 3b, 3c, and 3d of $n^+$-type having a higher impurity concentration than the charge transport region 1 are provided in an upper portion of the injection control region 2.

Although not illustrated in FIG. 2, contact regions of the second conductivity-type ($p^+$-type) in contact with the main charge supply regions 3a to 3d may be provided in the upper portion of the injection control region 2, For example, the main charge supply regions 3a to 3d and the contact regions may be repeatedly and alternately arranged parallel to the extending direction of the stripes 511, 512, 521, and 522 of the gate trenches 51 and 52 illustrated in FIG. 1.

As illustrated in FIG. 2, the dummy trench 42 and the gate trench 51 are provided so as to penetrate the top surfaces of the main charge supply regions 3a to 3d through the injection control region 2 to reach an upper portion of the charge transport region 1. The dummy trench 42 and the gate trench 51 have substantially the same depth.

The dummy trench 42 and the gate trench 51 are provided with gate insulating films 6 laminated on bottom and side surfaces. Examples of films used as the gate insulating films 6 include a silicon oxide ($SiO_2$) film, a silicon oxynitride (SiON) film, a strontium oxide (SrO) film, a silicon nitride ($Si_3N_4$) film, an aluminum oxide ($Al_2O_3$) a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, a bismuth oxide ($Bi_2O_3$) film, and a composite film including two or more of these films stacked on one another.

The gate insulating film 6 laminated on the gate trench 51 serves as a gate film which statically controls a surface potential of channels formed in the injection control region 2 immediately below the main charge supply regions 3a to 3d. The gate insulating film 6 laminated on the dummy trench 42 does not serve as a gate film, but still needs to exert substantial insulating properties in view of the operation of the device. Since the bottom region of the dummy trench 42 at which an electric field crowds is required to ensure the insulating properties most, the gate insulating film 6 in the dummy trench 42 also needs to ensure the reliability with respect to the TDDB behavior in which dielectric breakdown is caused with time, as in the case of the gate insulating film 6 in the gate trench 51. The reliability for the TDDB can be enhanced by voltage application so as to screen out defects, such as an abnormality in shape of the dummy trench 42 and the gate trench 51, and quality-degradation of the gate insulating films 6 inserted between the respective dummy trench 42 and gate trench 51 and the electrodes.

A dummy electrode 72 is buried in the dummy trench 42 via the gate insulating film 6. The dummy electrode 72 can reduce a capacitance between the gate and the collector causing switching loss, for example. A gate electrode 71 is buried in the gate trench 51 via the gate insulating film 6. A material used for the dummy electrode 72 and the gate electrode 71 can be DODOS. The other dummy trenches 41, 43, and 44 illustrated in FIG. 1 have the same structure as the dummy trench 42. The gate trench 52 illustrated in FIG. 1 has the same structure as the gate trench 51.

As illustrated in FIG. 2, the interlayer insulating films (11, 12, 13) are provided on the gate electrode 71. The interlayer insulating films (11, 12, 13) on the gate electrode 71 have a three-layer structure including the insulating film 11 for testing, an insulating film 12 for connection provided on the insulating film 11 for testing, and an upper-layer insulating film 13 provided on the insulating film 12 for connection. The interlayer insulating films (12, 13) are provided on the dummy electrode 72. The interlayer insulating films (12, 13) on the dummy electrode 72 have a two-layer structure including the insulating film 12 for connection and the upper-layer insulating film 13 provided on the insulating film 12 for connection without the insulating film 11 for testing. The interlayer insulating films (11, 12, 13) on the gate electrode 71 thus have a stacked structure including a greater number of the insulating films by at least one layer than the interlayer insulating films (12, 13) on the dummy electrode 72.

For example, a thickness of the insulating film 11 for testing on the gate electrode 71 is in a range of about 50 to 100 nanometer, a thickness of the insulating film 12 for connection on the gate electrode 71 and the dummy electrode 72 is in a range of about 50 to 100 nanometer, and a thickness of the upper-layer insulating film 13 on the gate electrode 71 and the dummy electrode 72 is in a range of about 50 to 100 nanometers.

The upper-layer insulating film 13 is not necessarily provided on each of the gate electrode 71 and the dummy electrode 72. When the upper-layer insulating film 13 is not provided, the two interlayer insulating films (11, 12) including the insulating film 11 for testing and the insulating film 12 for connection on the insulating film 11 are provided on the gate electrode 71 to implement a two-layer structure, while only the insulating film 12 for connection is provided on the dummy electrode 72 to implement a single-layer structure.

The insulating film 11 for testing is provided to cover the gate trenches 51 and 52 and the gate surface interconnection 14 illustrated in FIG. 1. The insulating film 12 for connection and the upper-layer insulating film 13 illustrated in FIG. 2 are provided on the entire top surface of the semiconductor substrate 1, although not illustrated in FIG. 1. The insulating film 12 for connection and the upper-layer insulating film 13, which are omitted in FIG. 1, are provided with contact holes 31a to 31j and contact holes 32a to 32h as indicated by the dashed and dotted lines in FIG. 1.

Examples of films used as the insulating film 11 for testing, the insulating film 12 for connection, and the upper-layer insulating film 13 include a high temperature oxide film (HTO film), and a non-doped silicon oxide ($SiO_2$) film without including phosphorus (P) or boron (B), which is referred to as non-doped silicate glass (NSG). Other examples of films used as the insulating film 11 for testing, the insulating film 12 for connection, and the upper-layer insulating film 13 include a phosphosilicate glass (PSG) film, a borosilicate glass (BSG) film, a borophosphosilicate glass (BPSG) film, and a silicon nitride ($Si_3N_4$) film. Alternatively, the insulating film 11 for testing, the insulating film 12 for connection, and the upper-layer insulating film 13 each may be a stacked layer of the above-listed films. A material used for the insulating film 11 for testing, the insulating film 12 for connection, and the upper-layer insulating film 13 may be either the same as or different from each other. For example, the insulating film 11 for testing and the insulating film 12 for connection may be made of a HTO film, and the upper-layer insulating film 13 may be made of a reflowable BPSG film.

A main charge supply electrode (emitter electrode) 15 is deposited on the upper-layer insulating film 13. The main charge supply electrode 15 is electrically or metallurgically connected to the main charge supply regions 3a to 3d, for example, via the contact holes 31a to 31j open in the insulating film 12 for connection and the upper-layer insulating film 13.

As illustrated in FIG. 1, the connection lands 15a to 14d are provided on the end portions of the dummy trenches 41 to 44. The dummy trenches 41 to 44 are electrically connected to the main charge supply electrode 15 via the contact holes 32a to 32h open in the insulating film 12 for connection and the upper-layer insulating film 13 on the connection lands 15a to 14d. FIG. 1 schematically indicates the positions of the contact holes 32a to 32h by the dashed and dotted lines.

The gate surface interconnection 14 is provided on the connection parts 513 and 523 of the gate trenches 51 and 52 so as to be in contact with the connection parts 513 and 523. The gate surface interconnection 14 is electrically insulated and separated from the dummy trenches 41 to 44 not contributing to the formation of the channels.

Figure 3:
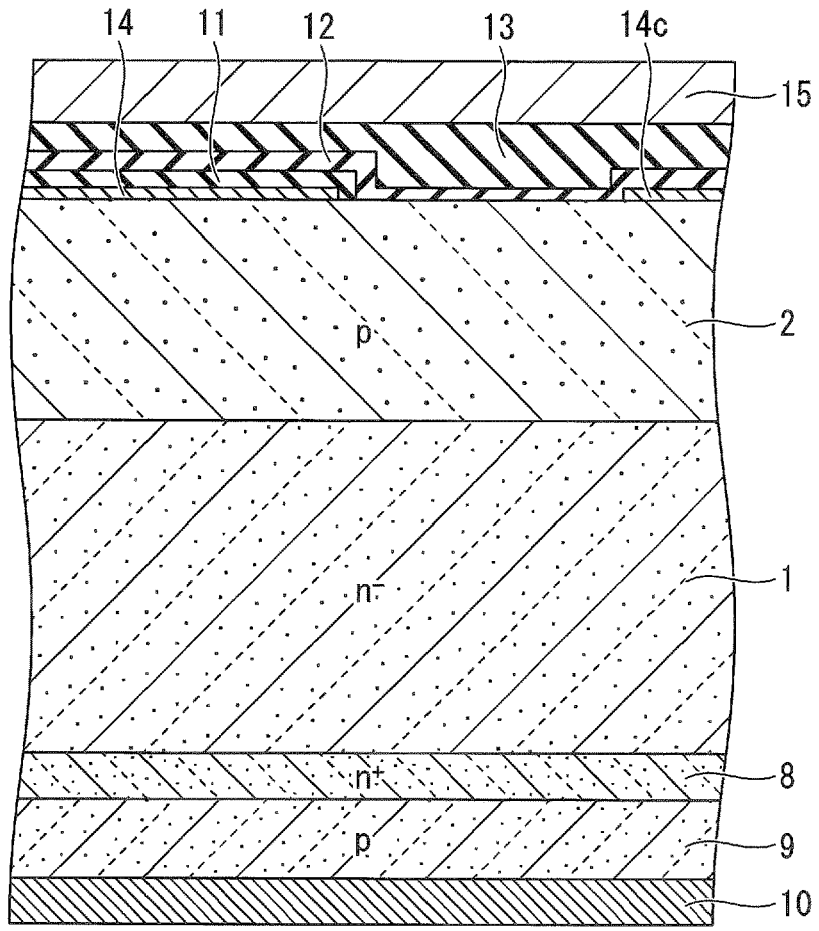
FIG. 3 is a cross-sectional view as viewed from direction B-B' in FIG. 1.

FIG. 3 is a cross-sectional view as viewed from direction B-B' in FIG. 1. As illustrated in FIG. 3, the gate surface interconnection 14 and the connection land 14c are separately deposited on the injection control region 2. The insulating film 11 for testing is provided to cover the gate interconnection 14. The insulating film 12 for connection and the upper-layer insulating film 13 are provided on the insulating film 11 for testing and the connection land 14c.

A field stop layer 8 of $n^+$-type is deposited under the charge transport region 1 illustrated in FIG. 2. A buffer layer may be used instead of the filed stop layer 8, or a non-punch-through structure without including the field stop layer 8 may be employed. A main charge reception region (collector region) 9 of $p^+$-type is deposited under the field stop layer 8, and a main charge reception electrode (collector electrode) 10 is further deposited under the collector region 9. The main charge reception electrode 10 used may be a single film of gold (Au), or a metal film in which aluminum (Al), nickel (Ni), and Au are stacked in this order.

During the operation of the insulated-gate semiconductor device according to the embodiment, a positive voltage is applied to the main charge reception electrode 10, and at the same time, a positive voltage of a threshold or greater is also applied to the gate electrode 71 while the main charge supply electrode 15 is grounded. The surface potential of the injection control region 2 facing the gate trench 51 is statically controlled via the gate insulating film 6 to form channels, so as to turn on the IGBT. In the ON state, electrons as majority carriers are injected in the charge transport region 1 from the main charge supply regions 3a to 3d, and holes as minority carriers are injected in the charge transport region 1 from the collector region 9. The electrons and the holes injected in the charge transport region 1 cause conductivity modulation to reduce the resistance in the charge transport region 1. The deposition of the dummy electrode 72 adjacent to the gate electrode 71 partly replaces the capacitance between the gate and the collector (feedback capacitance) with the capacitance between the collector and the emitter, so as to reduce the feedback capacitance to improve a switching speed.

When the voltage applied to the gate electrode 71 falls below the threshold, the channels of the electrons formed in the injection control region 2 are lost to switch the IBGT to the OFF state. In the OFF state, the electrons accumulated in the charge transport region 1 are discharged from the collector region 9, and the holes accumulated in the charge transport region 1 are discharged from the contact regions.

<Method of Manufacturing Insulated-Gate Semiconductor Device>

An example of a method of manufacturing the insulated-gate semiconductor device according to the embodiment, including a method of screening the insulated-gate semiconductor device, is described below with reference to FIG. 4 to FIG. 15. The following explanations are made while mainly focusing on the cross section in which the dummy trench 42 and the gate trench 51 appear as illustrated in FIG. 2.

Figure 4:
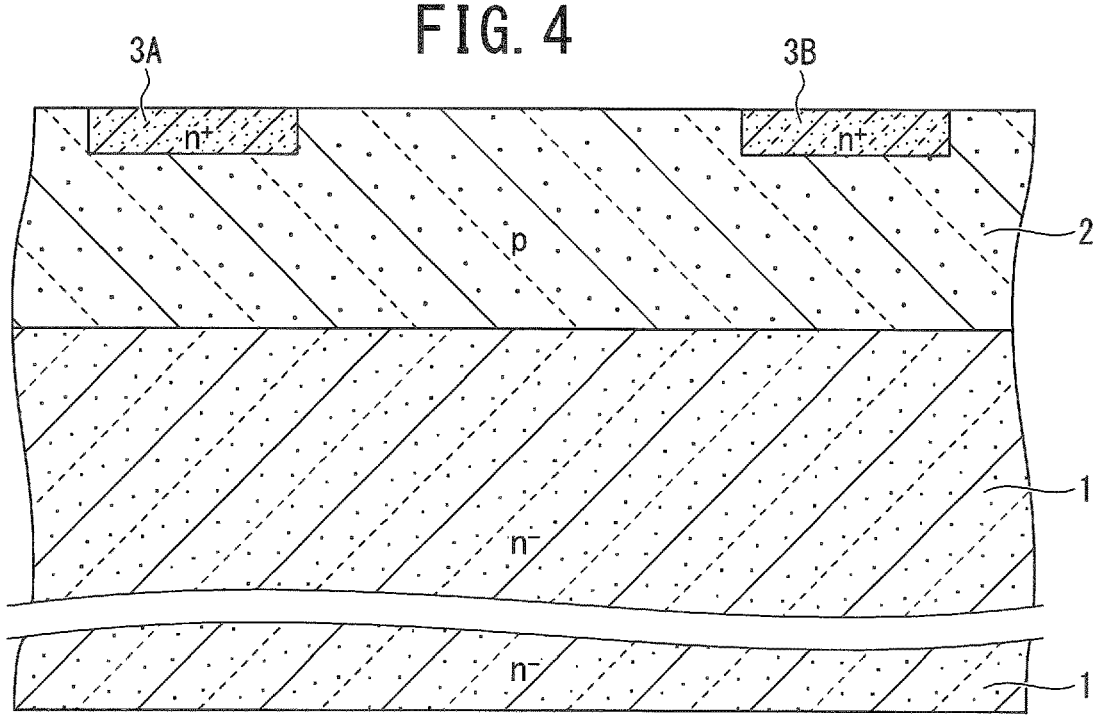
FIG. 4 is a cross-sectional view illustrating a process of manufacturing the insulated-gate semiconductor device according to the embodiment of the present invention.

First, a semiconductor substrate 1 made of Si of $n^-$-type is prepared as a base-body portion (refer to FIG. 2). Next, p-type impurity ions are implanted entirely into the upper surface of the semiconductor substrate 1. The p-type impurity ions are activated to be used as p-type impurities by annealing, and are thermally diffused to a depth necessary for the injection control region 2 to be formed. The injection control region 2 may be grown epitaxially on the top surface of the semiconductor substrate 1. Subsequently, a photoresist film is coated on the top surface of the injection control region 2, and is delineated by photolithography. Using the delineated photoresist film as an ion implantation mask, n-type impurity ions are selectively implanted into the top surface of the injection control region 2. The implanted n-type impurity ions are then activated and thermally diffused by annealing, so as to form electrode region-presumed layers 3A and 3B of $n^+$-type in the upper portion of the injection control region 2, as illustrated in FIG. 4.

Figure 5:
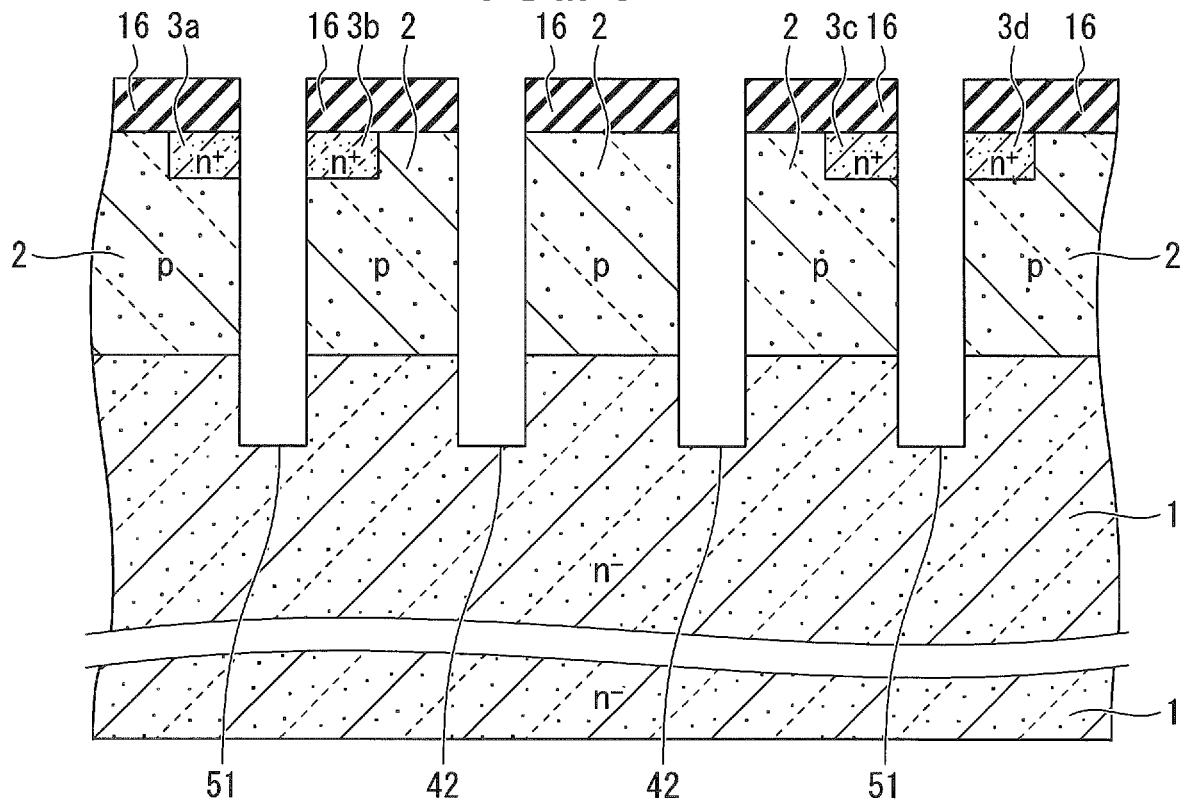
FIG. 5 is a cross-sectional view, continued from FIG. 4, illustrating the process of manufacturing the insulated-gate semiconductor device according to the embodiment of the present invention.

Next, an etching passivation film 16 such as an oxide film is laminated on the top surfaces of the injection control region 2 and the electrode region-presumed layers 3A and 3B by a deposition method such as chemical vapor deposition (CVD). The etching passivation film 16 is delineated by photolithography and dry etching such as reactive ion etching (RIE). Using the delineated etching passivation film 16 as a mask for etching, the dummy trench 42 and the gate trench 51 are selectively formed by dry etching such as RIE, as illustrated in FIG. 5. The electrode region-presumed layers 3A and 3B illustrated in FIG. 4 are divided into the main charge supply regions (emitter regions) 3a to 3d as illustrated in FIG. 5. The dummy trench 42 and the gate trench 51 penetrate the main charge supply regions 3a to 3d and the injection control region 2 to reach the upper portion of the semiconductor substrate 1. The dummy trenches 41, 43, and 44 and the gate trench 52 illustrated in FIG. 1 are also formed at the same time in the same manner as the dummy trench 42 and the gate trench 51. The etching passivation film 16 is then removed.

Figure 6:
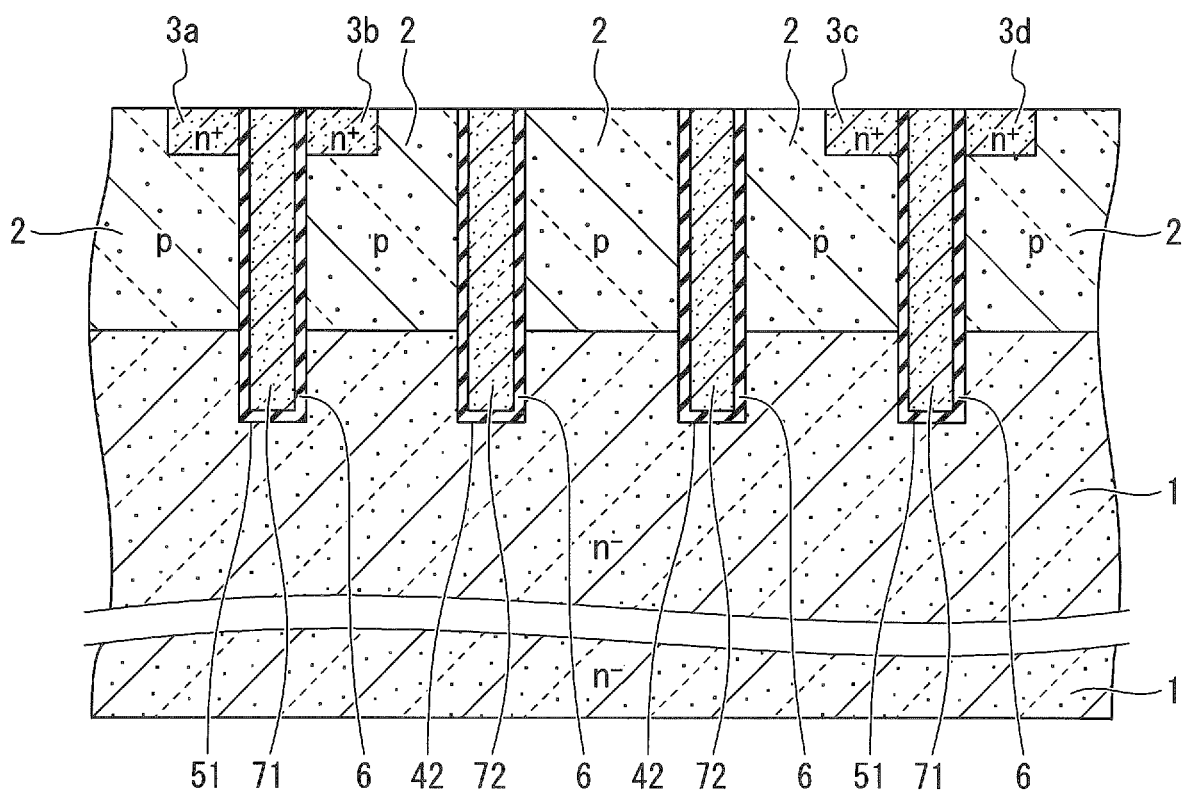
FIG. 6 is a cross-sectional view, continued from FIG. 5, illustrating the process of manufacturing the insulated-gate semiconductor device according to the embodiment of the present invention.

Next, the gate insulating films 6 such as $SiO_2$ films are laminated on the bottom and side surfaces of the dummy trench 42 and the gate trench 51 and on the top surfaces of the injection control region 2 and the main charge supply regions 3a to 3d by thermal oxidation or CVD. A conductive film (conductive film for filling) such as a DOPOS film (first DOPOS film) is deposited to fill each of the dummy trench 42 and the gate trench 51 by a deposition method such as CVD. The conductive film for filling and the gate insulating films 6 are then removed from the top surfaces of the injection control region 2 and the main charge supply regions 3a to 3d by etch back or chemical mechanical polishing (CMP), so as to expose the top surfaces of the injection control region 2 and the main charge supply regions 3a to 3d. The dummy electrode 72 and the gate electrode 71 made of the conductive film for filling are thus buried in the dummy trench 42 and the gate trench 51 via the gate insulating films 6 as illustrated in FIG. 6.

Figure 7:
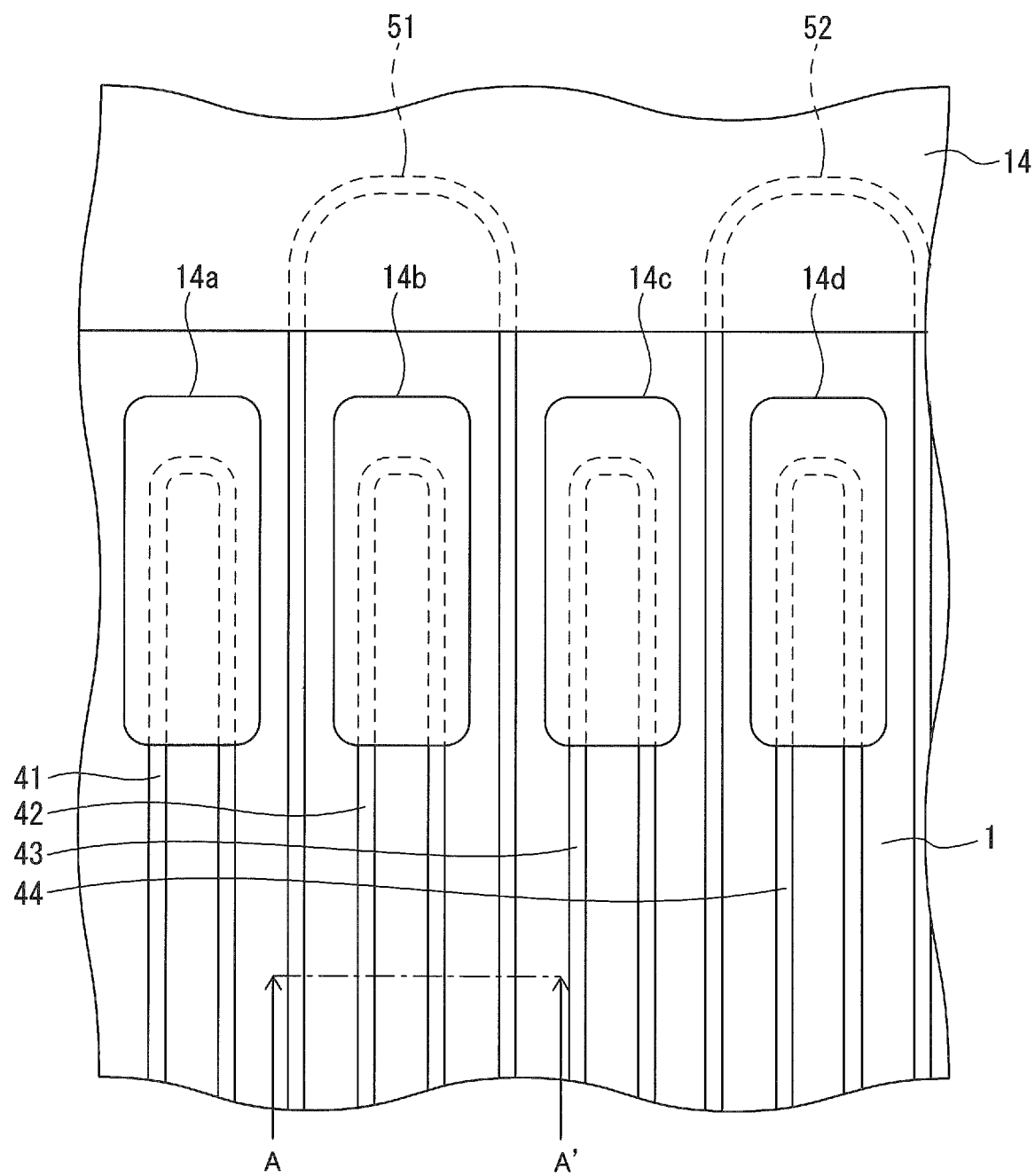
FIG. 7 is a cross-sectional view, continued from FIG. 6, illustrating the process of manufacturing the insulated-gate semiconductor device according to the embodiment of the present invention.

Next, a delineation conductive film such as another DOPOS film (second DOPOS film) is deposited by a deposition method such as CVD. The delineation conductive film is delineated by dry photolithography and etching such as RIE, so as to form the gate surface interconnection 14 and the connection lands 15a to 14d as illustrated in FIG. 7. The connection lands 15a to 14d are locally formed on the end portions of the dummy trenches 41 to 44 so as to be in contact with the dummy trenches 41 to 44. The gate surface interconnection 14 is separated from the connection lands 15a to 14d, and is provided on the connection parts 513 and 523 of the gate trenches 51 and 52 so as to be in contact with the connection parts 513 and 523.

Figure 8A:
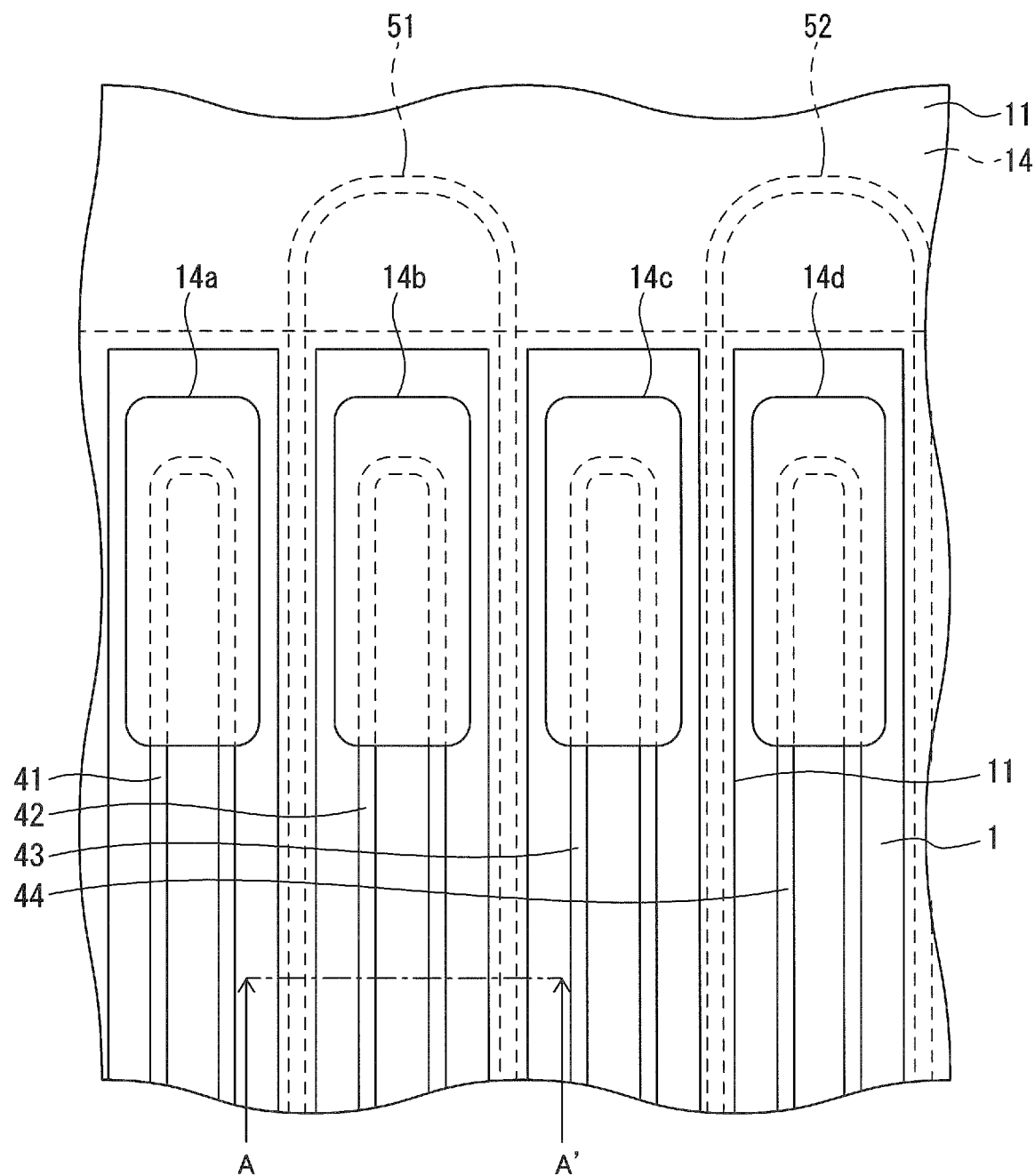
FIG. 8A is a cross-sectional view, continued from FIG. 7, illustrating the process of manufacturing the insulated-gate semiconductor device according to the embodiment of the present invention.

Next, the insulating film 11 for testing such as a HTO film is deposited on the top surfaces of the dummy electrode 72, the gate electrode 71, the injection control region 2, and the main charge supply regions 3a to 3d by a deposition method such as CVD. The insulating film 11 for testing is delineated by photolithography and dry etching. The delineated insulating film 11 for testing is thus provided to cover the gate surface interconnection 14 and the gate trenches 51 and 52 as illustrated in FIG. 8A. The top surfaces of the connection lands 15a to 14d and the dummy trenches 41 to 44 are thus exposed to the openings of the insulating film 11 for testing.

Figure 8B:
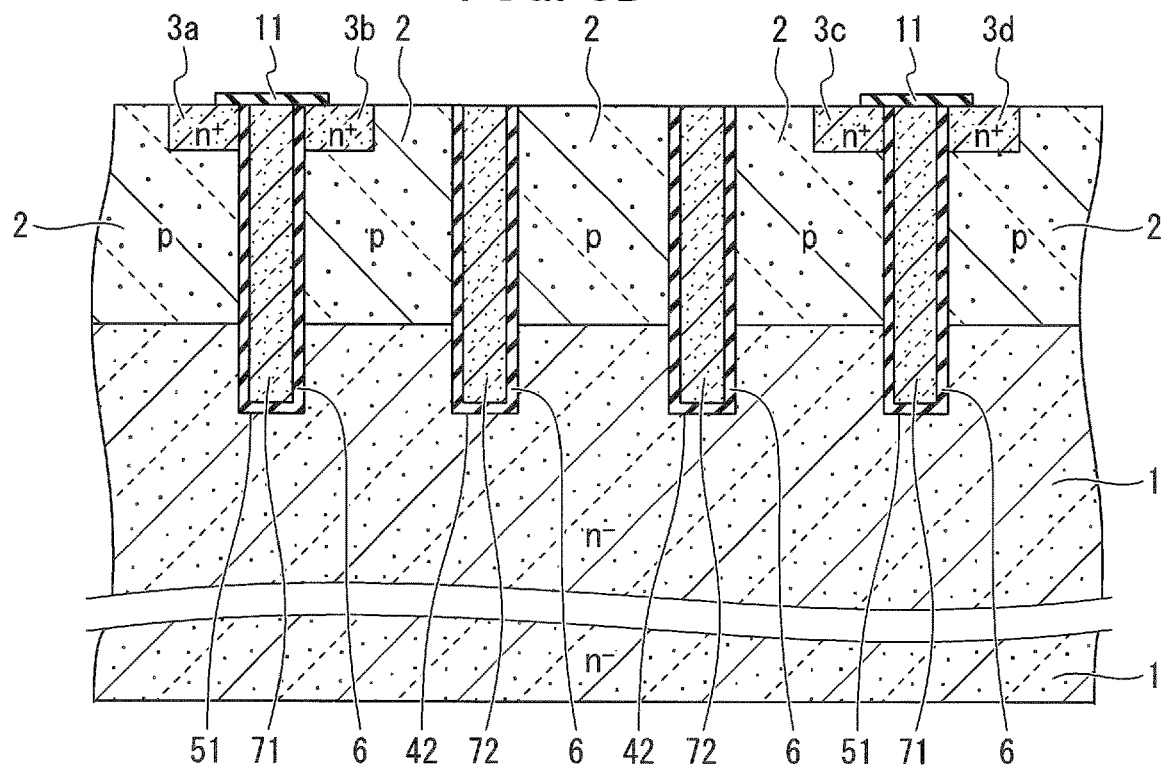
FIG. 8B is a cross-sectional view as viewed from direction A-N in FIG. 8A

FIG. 8B is a cross-sectional view as viewed from direction A-A' in FIG. 8A. As illustrated in FIG. 8B, the top surface of the gate electrode 71 is covered with the insulating film 11 for testing. The top surface of the dummy electrode 72 is not covered with the insulating film 11 for testing but is exposed.

Figure 9:
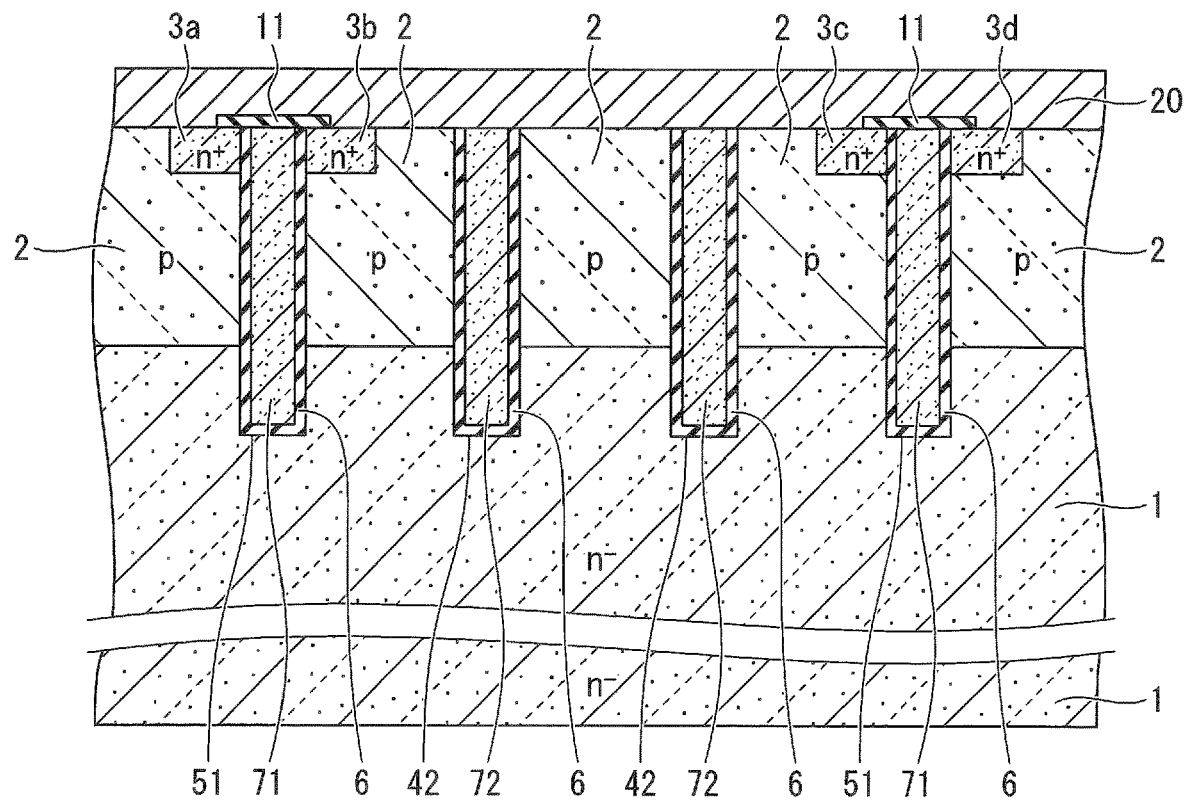
FIG. 9 is a cross-sectional view; continued from FIG. 8A and FIG. 8B, illustrating the process of manufacturing the insulated-gate semiconductor device according to the embodiment of the present invention.

Next, as illustrated in FIG. 9, a conductive film 20 for testing such as a third DOPOS film is entirely formed on the top surfaces of the dummy electrode 72, the injection control region 2, and the main charge supply regions 3a to 3d by a deposition method such as CVD.

Figure 10:
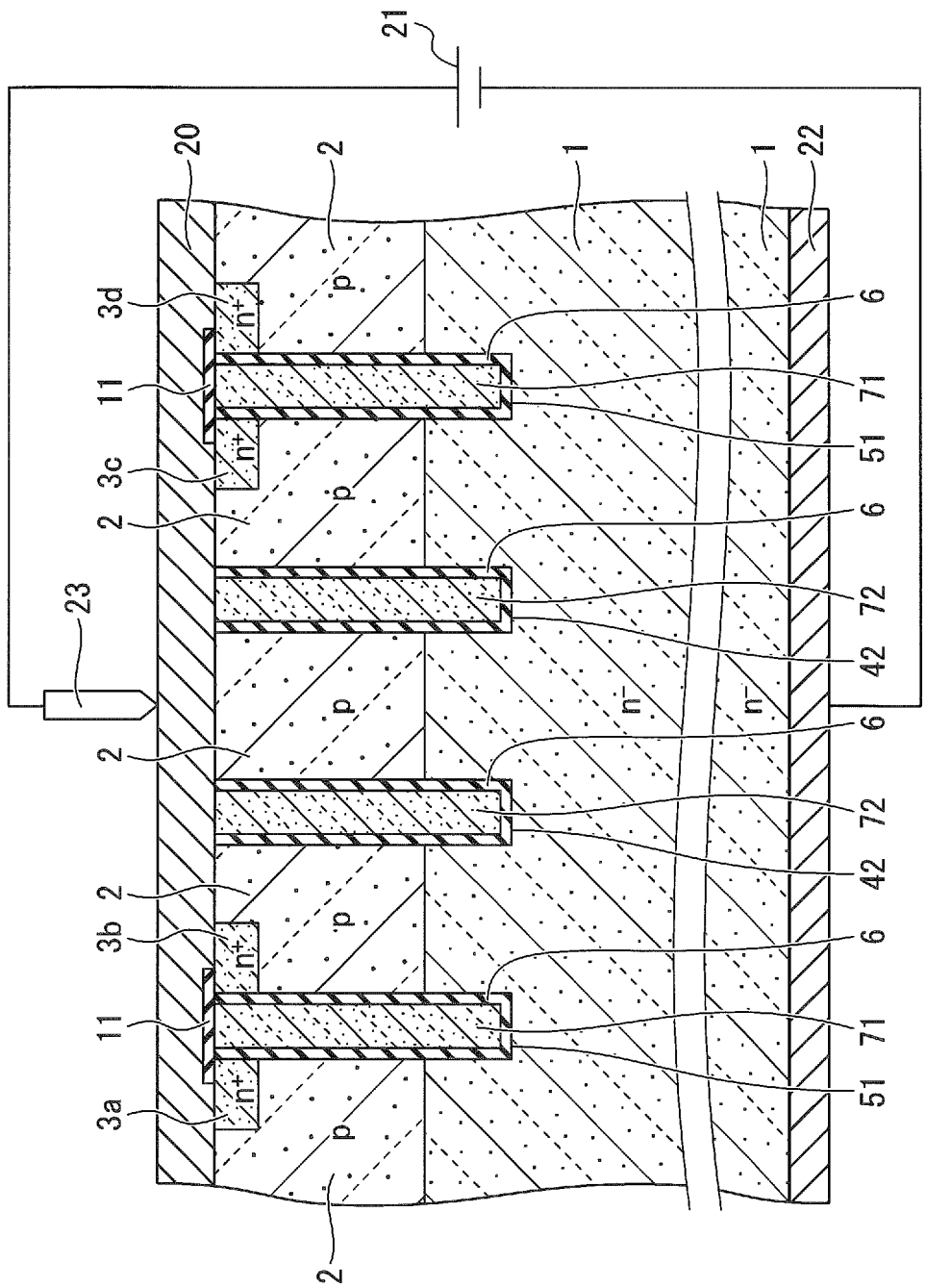
FIG. 10 is a cross-sectional view, continued from FIG. 9, illustrating the process of manufacturing the insulated-gate semiconductor device according to the embodiment of the present invention.

Next, only the gate insulating film 6 of the dummy trench 42 is subjected to insulating property testing so as to be screened, independently of the gate insulating film 6 of the gate trench 51, by use of the conductive film 20 for testing deposited on the entire surface. In particular, as illustrated in FIG. 10, the bottom surface of the semiconductor substrate 1 is placed on a conductive stage 22. A negative electrode of a power supply 21 is electrically connected to the stage 22, and a tip of a probe needle 23 electrically connected to a positive electrode of the power supply 21 is pressed against the conductive film 20 for testing. A higher voltage than a voltage in normal operation is applied between the conductive film 20 for testing and the bottom surface of the semiconductor substrate 1 from the power supply 21 so as to carry out dummy gate shock testing. The dummy gate shock testing is an acceleration test for evaluating the TDDB behavior. The dummy gate shock testing is performed such that a higher voltage (about 4 MV/cm, for example) than a voltage normally applied between a dummy gate and a collector (about 2 MV/cm, for example) is applied between the conductive film 20 for testing and the bottom surface of the semiconductor substrate 1. A current flowing between the conductive film 20 for testing and the bottom surface of the semiconductor substrate 1 is then measured. When a leakage current between the conductive film 20 for testing and the bottom surface of the semiconductor substrate 1 is a reference value or greater, the gate insulating film 6 is determined to be degraded, so as to reliably confirm the insulating properties of the gate insulating film 6 accordingly.

Figure 11:
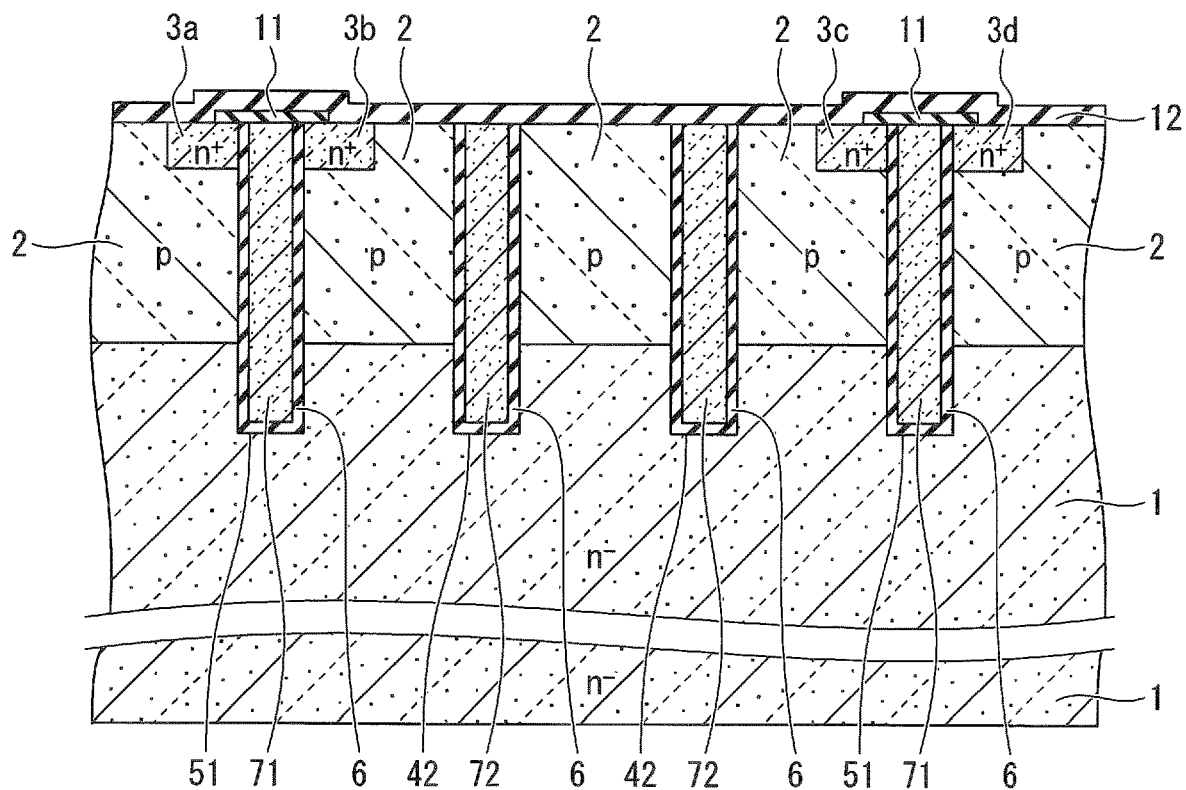
FIG. 11 is a cross-sectional view, continued from FIG. 10, illustrating the process of manufacturing the insulated-gate semiconductor device according to the embodiment of the present invention.

Next, the conductive film 20 for testing is removed. As illustrated in FIG. 11, the insulating film 12 for connection such as a HTO film is then deposited on the entire top surface of the semiconductor substrate 1, namely, on the top surfaces of the dummy electrode 72, the insulating film 11 for testing, the injection control region 2, and the main charge supply regions 3a to 3d by a deposition method such as CVD. The material used for the insulating film 12 for connection may be either the same as or different from the material used for the insulating film 11 for testing. The insulating film 11 for testing may be removed before the deposition of the insulating film 12 for connection.

Figure 12:
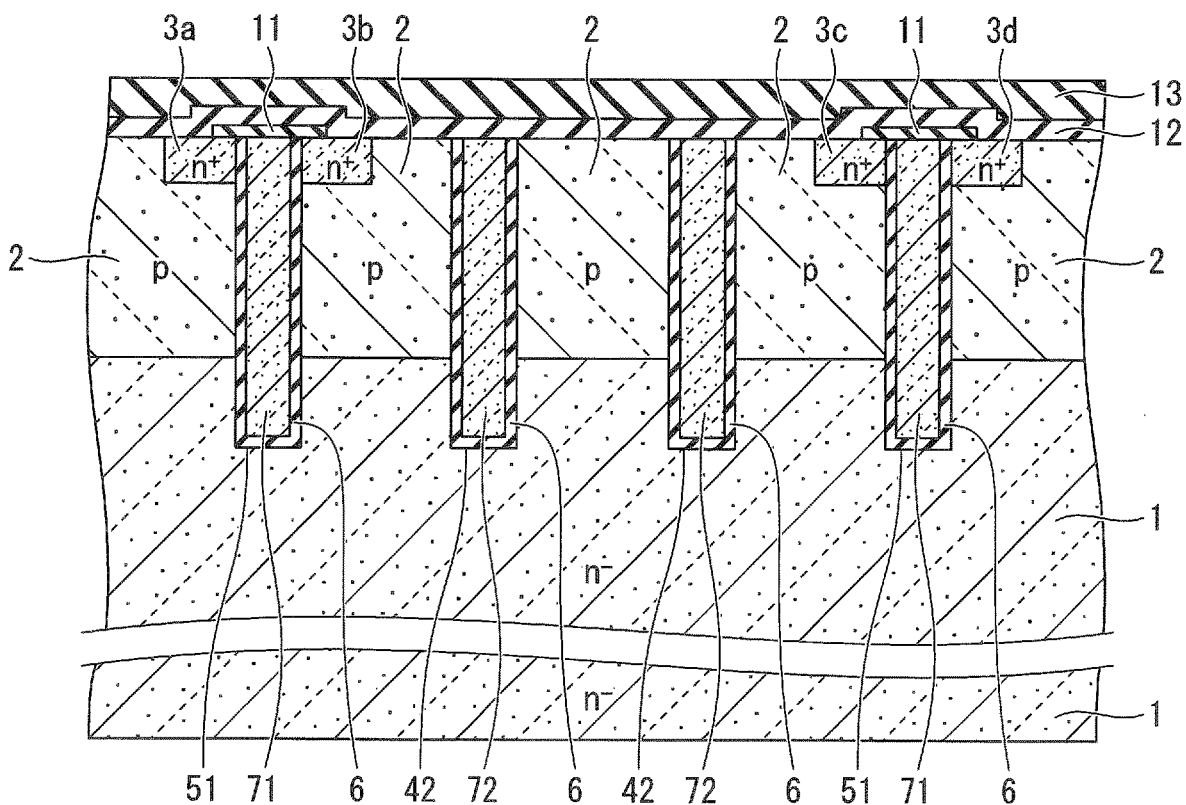
FIG. 12 is a cross-sectional view, continued from FIG. 11, illustrating the process of manufacturing the insulated-gate semiconductor device according to the embodiment of the present invention.
Figure 13:
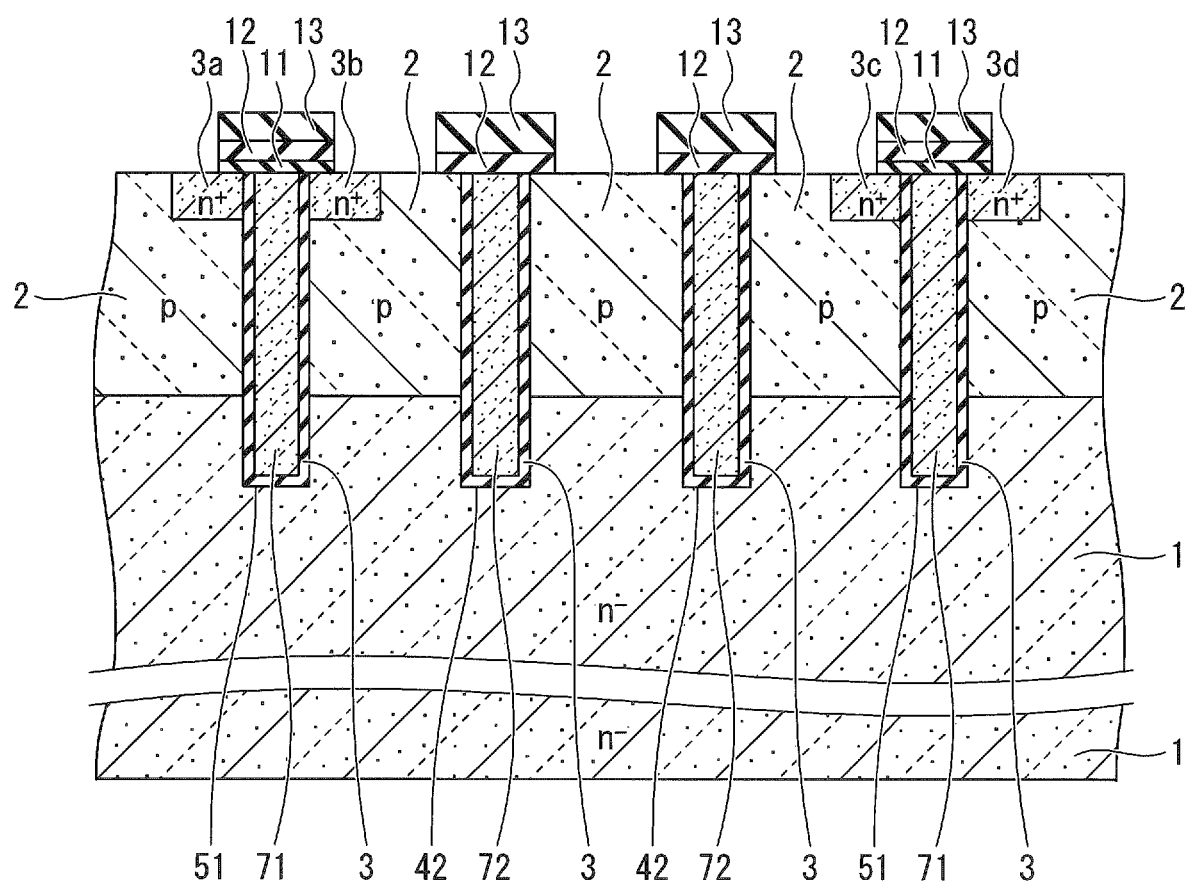
FIG. 13 is a cross-sectional view, continued from FIG. 12, illustrating the process of manufacturing the insulated-gate semiconductor device according to the embodiment of the present invention.

Next, as illustrated in FIG. 12, the upper-layer insulating film 13 such as a BPSG film is deposited on the entire top surface of the insulating film 12 for connection by a deposition method such as CVD. The material used for the upper-layer insulating film 13 may be the same as or different from the material of each of the insulating film 11 for testing and the insulating film 12 for connection. The upper-layer insulating film 13 is not necessarily provided.

Next, the insulating film 12 for connection and the upper-layer insulating film 13 are partly and selectively removed by photolithography and dry etching. The insulating film 12 for connection and the upper-layer insulating film 13 are thus provided with contact holes so as to expose the top surfaces of the main charge supply regions 3a to 3d. The contact holes may be formed only in the insulating film 12 for connection without the upper-layer insulating film 13 provided. The insulating film 12 for connection and the upper-layer insulating film 13 are further provided with contact holes so as to expose the top surfaces of the connection lands 15a to 14d illustrated in FIG. 8A.

Figure 14:
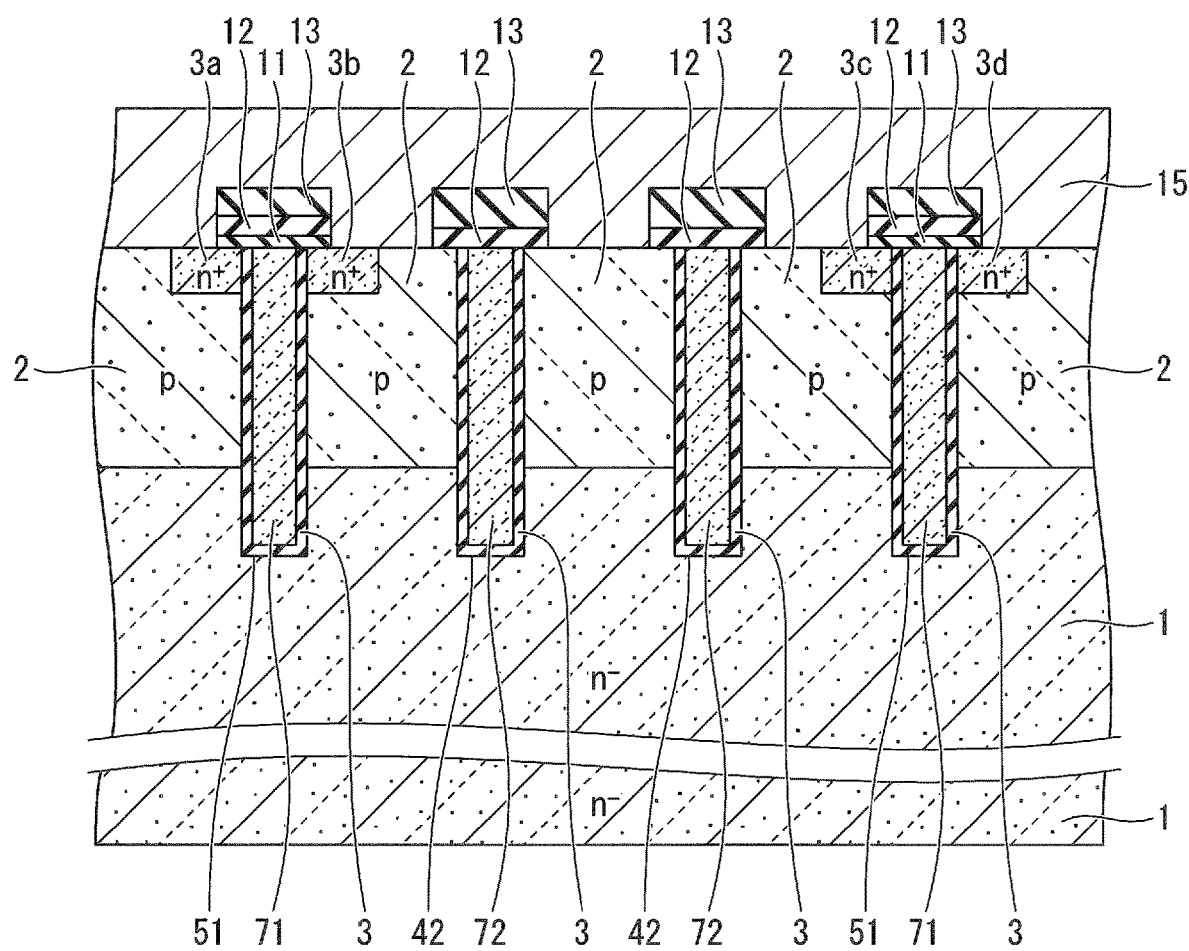
FIG. 14 is a cross-sectional view, continued from FIG. 13, illustrating the process of manufacturing the insulated-gate semiconductor device according to the embodiment of the present invention.

Next, a metallic layer such as an Al film is entirely deposited over the upper-layer insulating film 13, the main charge supply regions 3a to 3d, and the connection lands 15a to 14d by sputtering or evaporation. The metallic layer such as an Al film is delineated by photolithography and dry etching such as RIE, so as to form the main charge supply electrode 15 brought in ohmic contact with the main charge supply regions 3a to 3d via the contact holes as illustrated in FIG. 14.

Figure 15:
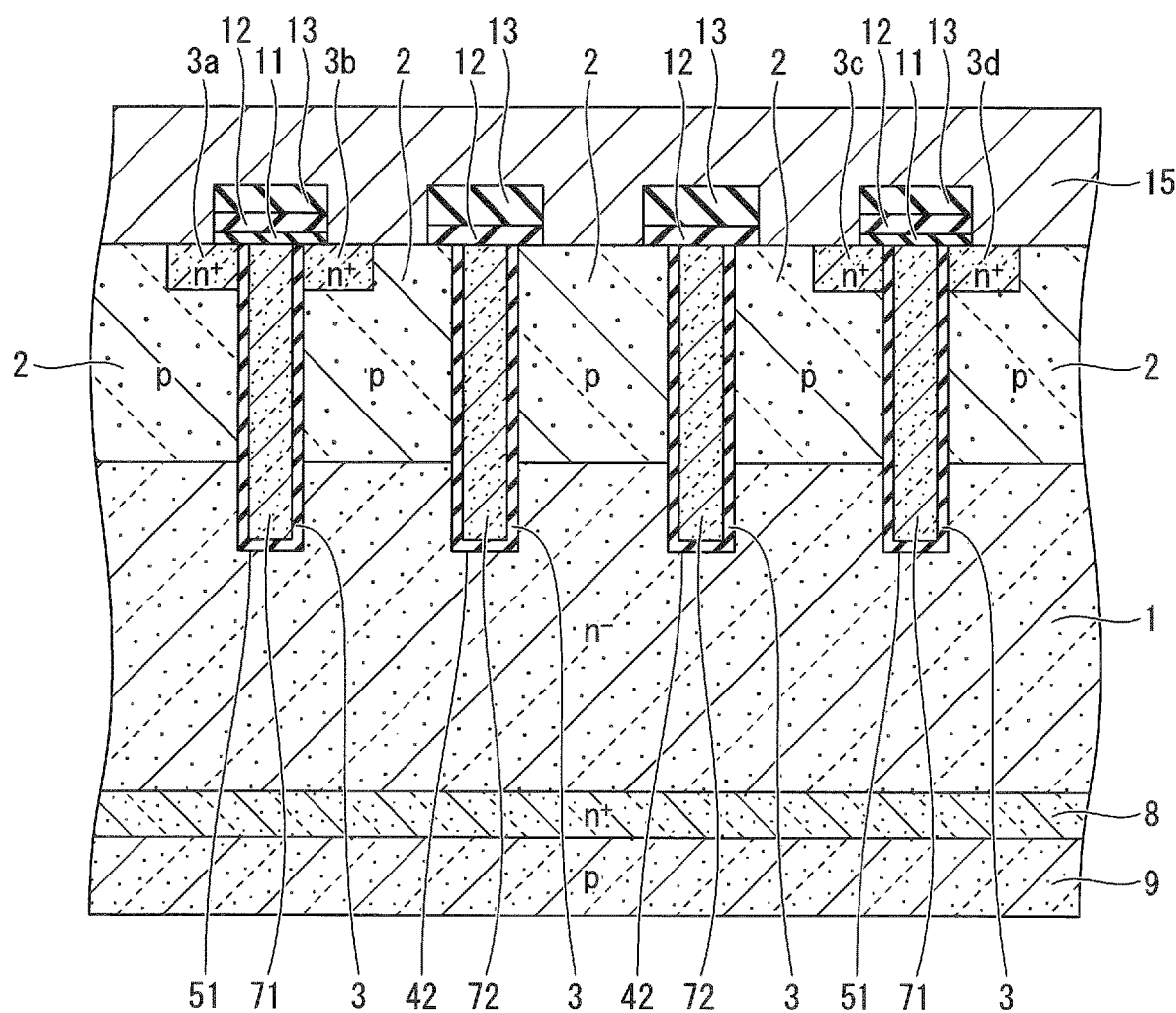
FIG. 15 is a cross-sectional view, continued from FIG. 14, illustrating the process of manufacturing the insulated-gate semiconductor device according to the embodiment of the present invention.

Next, the thickness of the semiconductor substrate 1 is adjusted by CMP, for example. After the thickness adjustment, p-type impurity ions are implanted into the bottom surface of the semiconductor substrate 1. Further, n-type impurity ions are implanted into the bottom surface of the semiconductor substrate 1 to a depth having a deeper projected range than the depth of the ion implantation of the p-type impurity ions. The implanted impurity ions are then activated and thermally diffused by annealing, so as to form the $n^+$-type field stop layer 8 and the $p^+$-type collector region 9 as illustrated in FIG. 15. The field stop layer 8 and the collector region 9 may be sequentially epitaxially grown on the bottom surface of the semiconductor substrate 1.

Next, the main charge reception electrode 10 such as a film including Au is formed on the bottom surface of the collector region 9 by sputtering or evaporation, as illustrated in FIG. 2. The semiconductor wafer is then diced into a plurality of semiconductor chips, so as to complete the insulated-gate semiconductor device according to the embodiment.

The obtained semiconductor chips are then each subjected to the gate shock testing to test the insulating properties of the gate insulating films 6 in the gate trenches 51 and 52 so as to screen out the defective gate insulating films 6 in the gate trenches 51 and 52. This screening is the first gate shock testing for the gate insulating films 6 in the gate trenches 51 and 52.

The method of manufacturing the insulated-gate semiconductor device according to the embodiment tests the insulating properties of the gate insulating films 6 in the dummy trenches 41 to 44, so as to reliably ensure the quality of the gate insulating films 6 in the dummy trenches 41 to 44. Since the gate trenches 51 and 52 are covered with the insulating film 11 for testing at this point, only the gate insulating films 6 in the dummy trenches 41 to 44 can be subjected to the insulating property testing independently of the gate insulating films 6 in the gate trenches 51 and 52. This can eliminate the influence of the testing on the gate insulating films 6 in the gate trenches 51 and 52. Since the required insulating properties are lower for the gate insulating films 6 in the dummy trenches 41 to 44 than for the gate insulating films 6 in the gate trendies 51 and 52, the value of the voltage applied during the screening testing can be lessened in view of the resistance necessary for the gate insulating films 6 in the dummy trenches 41 to 44. The incidence of defects thus can be reduced to decrease the amount of particles derived from defects caused, so as to avoid environmental contamination during the manufacture process. The gate insulating films 6 in the gate trenches 51 and 52 are subjected to the gate shock testing to test the insulating properties of the gate insulating films 6 in the gate trenches 51 and 52 after the manufacture process ends, so as to screen out damage caused in the rest of the process.

Comparative Example

Figure 16:
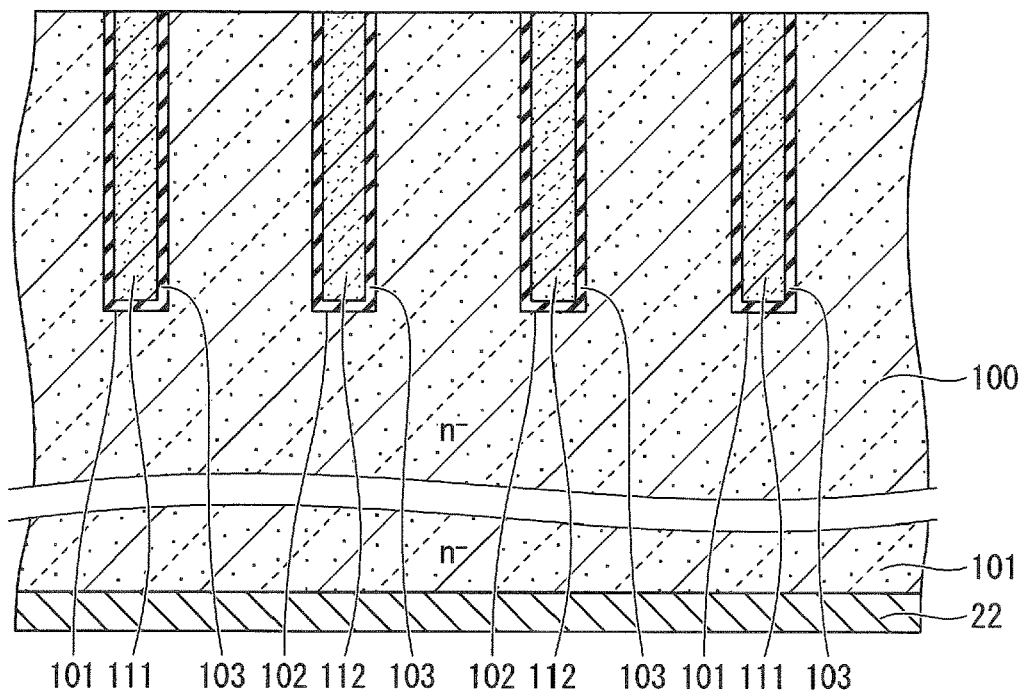
FIG. 16 is a cross-sectional view illustrating a process of manufacturing an insulated-gate semiconductor device according to a comparative example.

A method of screening an insulated-gate semiconductor device of a comparative example is described below. As illustrated in FIG. 16, the method of screening the insulated-gate semiconductor device of the comparative example prepares a gate trench 101 and a dummy trench 102 in the upper portion of a semiconductor substrate 100. A gate electrode 111 is then buried in the gate trench 101 via a gate insulating film 103. A dummy electrode 112 is buried in the dummy trench 102 via the gate insulating film 103.

Figure 17:
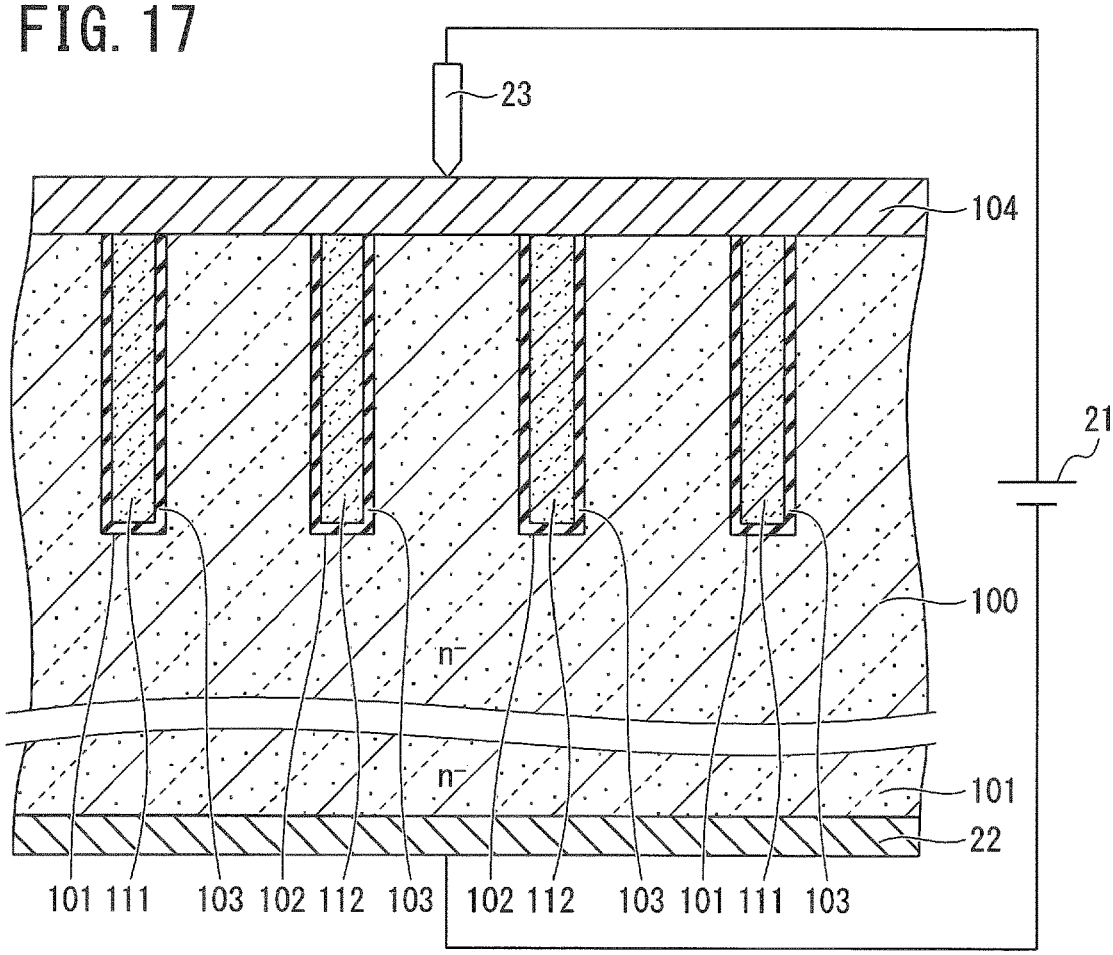
FIG. 17 is a cross-sectional view, continued from FIG. 16, illustrating the process of manufacturing the insulated-gate semiconductor device according to the comparative example.

Next, as illustrated in FIG. 17, a conductive film 104 is entirely formed on the top surfaces of the gate electrode 111 and the dummy electrode 112. The bottom surface of the semiconductor substrate 100 is then placed on the conductive stage 22. The negative electrode of the power supply 21 is electrically connected to the stage 22, and the tip of the probe needle 23 electrically connected to the positive electrode of the power supply 21 is pressed against the conductive film 104. A higher voltage than a voltage in normal operation is applied between the conductive film 104 and the bottom surface of the semiconductor substrate 100 from the power supply so as to carry out the gate shock testing. Since the gate trench 101 and the dummy trench 102 are entirely subjected to the testing simultaneously, a relatively large level of voltage is required to be applied during the testing, which produces a large amount of particles when defective elements are broken. In contrast, according to the method of screening the insulated-gate semiconductor device according to the embodiment of the present invention, since the gate trenches 51 and 52 are covered with the insulating film 11 for testing, only the gate insulating films 6 in the dummy trenches 41 to 44 can be independently subjected to the screening, so as to decrease the amount of particles to be generated accordingly.

Other Embodiments

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

The insulated-gate semiconductor device according to the embodiment has been illustrated with the case of using the IGBT having a trench gate structure, but is not limited to the IGBT. The embodiment may be applied to various types of insulated-gate semiconductor devices such as a trench gate MISFET.

The insulated-gate semiconductor device according to the embodiment has been illustrated with the case of being made of silicon (Si). The embodiment can also be applied to an insulated-gate semiconductor device made of a semiconductor (wide-bandgap semiconductor) material having a greater band gap than Si, such as silicon carbide (SiC), gallium nitride (GaN), diamond, or aluminum nitride (AlN).

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. An insulated-gate semiconductor device, comprising:
   a charge transport region of a first conductivity-type;
   an injection control region of a second conductivity-type provided on the charge transport region;
   a main charge supply region of the first conductivity-type provided on the injection control region;
   a dummy electrode buried, via a gate insulating film, in a dummy trench penetrating the main charge supply region and the injection control region to reach the charge transport region;
   a gate electrode buried, via the gate insulating film, in a gate trench penetrating the main charge supply region and the injection control region to reach the charge transport region;
   a first interlayer insulating film provided on the gate electrode, having a stacked structure and including a first plurality of insulating films;
   a second interlayer insulating film provided on the dummy electrode, a number of insulating films included in the first interlayer insulating film being greater by at least one than a number of insulating films included in the second interlayer insulating film; and
   a main charge supply electrode deposited on the first interlayer insulating film and the second interlayer insulating film, the first interlayer insulating film and the second interlayer insulating film being provided under at least a portion of the main charge supply electrode.

2. The insulated-gate semiconductor device of claim 1, wherein:
   the first plurality of insulating films include an insulating film for testing provided on the gate electrode, an insulating film for connection provided on the insulating film for testing, and an upper-layer insulating film provided on the insulating film for connection; and
   the second interlayer insulating film includes a second plurality of insulating films including the insulating film for connection provided on the dummy electrode and the upper-layer insulating film provided on the insulating film for connection provided on the dummy electrode.

3. The insulated-gate semiconductor device of claim 2, wherein the insulating film for testing and the insulating film for connection are made of an identical material.

4. The insulated-gate semiconductor device of claim 1, wherein the first interlayer insulating film is spaced apart from the second interlayer insulating film in a width direction which is perpendicular to a depth direction in which the dummy trench penetrates.

5. The insulated-gate semiconductor device of claim 1, wherein the second interlayer insulating film includes an insulating film which is in direct contact with the dummy electrode.

6. The insulated-gate semiconductor device of claim 1, wherein an insulating film of the second interlayer insulating film extends in a width direction and has a width in the width direction which is less than a width between the gate trench and the dummy trench, and
   the width direction is perpendicular to a depth direction in which the dummy trench penetrates.

7. The insulated-gate semiconductor device of claim 2, wherein:
   the insulating film for testing and the insulating film for connection included in the first plurality of insulating films are in direct contact with each other,
   the insulating film for connection and the upper-layer insulating film included in the first plurality of insulating films are in direct contact with each other, and
   the insulating film for connection and the upper-layer insulating film included in the second plurality of insulating films are in direct contact with each other.

8. The insulated-gate semiconductor device of claim 1, wherein:
   the first plurality of insulating films include an insulating film for testing provided on the gate electrode, and an insulating film for connection provided on the insulating film for testing; and
   the second interlayer insulating film includes the insulating film for connection provided on the dummy electrode.

9. A method of manufacturing an insulated-gate semiconductor device, comprising:
   forming an injection control region of a second conductivity-type on a charge transport region of a first conductivity-type;
   forming a main charge supply region of the first conductivity-type on the injection control region;
   digging a gate trench and a dummy trench so as to penetrate the main charge supply region and the injection control region;
   burying a dummy electrode in the dummy trench via a gate insulating film and burying a gate electrode in the gate trench via the gate insulating film;
   selectively forming an insulating film for testing so as to expose an upper portion of the dummy electrode and cover the gate electrode;
   depositing a conductive film for testing on the dummy electrode and the insulating film for testing; and
   selectively testing an insulating property of the gate insulating film in the dummy trench by applying a voltage between the conductive film for testing and the charge transport region.

10. The method of claim 9, further comprising removing the conductive film for testing after testing the insulating property.

11. The method of claim 10, further comprising:
    depositing an insulating film for connection so as to cover the insulating film for testing after removing the conductive film for testing;
    opening a contact hole in the insulating film for connection; and
    forming a main charge supply electrode electrically connected to the main charge supply region via the contact hole.

12. The method of claim 10, further comprising:
    depositing an insulating film for connection so as to cover the insulating film for testing after removing the conductive film for testing;
    depositing an upper-layer insulating film so as to cover the insulating film for connection;

opening a contact hole in each of the insulating film for connection and the upper-layer insulating film; and forming a main charge supply electrode electrically connected to the main charge supply region via the contact holes.

* * * * *